United States Patent
Peidous et al.

(10) Patent No.: US 11,699,615 B2
(45) Date of Patent: *Jul. 11, 2023

(54) HIGH RESISTIVITY SEMICONDUCTOR-ON-INSULATOR WAFER AND A METHOD OF MANUFACTURE

(71) Applicant: GlobalWafers Co., Ltd., Hsinchu (TW)

(72) Inventors: Igor Peidous, Liberty Township, OH (US); Lu Fei, San Francisco, CA (US); Jeffrey L. Libbert, O'Fallon, MO (US); Andrew M. Jones, Wildwood, MO (US); Alex Usenko, Lake St. Louis, MO (US); Gang Wang, Grover, MO (US); Shawn George Thomas, Chesterfield, MO (US); Srikanth Kommu, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/445,840

(22) Filed: Aug. 25, 2021

(65) Prior Publication Data

US 2021/0384070 A1 Dec. 9, 2021

Related U.S. Application Data

(60) Continuation of application No. 16/235,305, filed on Dec. 28, 2018, now Pat. No. 11,139,198, which is a division of application No. 15/526,640, filed as application No. PCT/US2015/060854 on Nov. 16, 2015, now Pat. No. 10,483,152.

(Continued)

(51) Int. Cl.
*H01L 21/762* (2006.01)

(52) U.S. Cl.
CPC .............. *H01L 21/76254* (2013.01)

(58) Field of Classification Search
CPC ......... H01L 21/02002; H01L 21/76254; H01L 21/762

See application file for complete search history.

(56) References Cited

U.S. PATENT DOCUMENTS

| 4,501,060 A | 2/1985 | Frye et al. |
| 4,755,865 A | 7/1988 | Wilson et al. |

(Continued)

FOREIGN PATENT DOCUMENTS

| EP | 0939430 A2 | 1/1999 |
| EP | 1865551 A2 | 12/2007 |

(Continued)

OTHER PUBLICATIONS

Unvala, B.A., Epitaxial Growth of Silicon by Vacuum Evaporation, Nature, Jun. 9, 1962, pp. 966-967, vol. 194.

(Continued)

*Primary Examiner* — Matthew C Landau
*Assistant Examiner* — Dmitriy Yemelyanov
(74) *Attorney, Agent, or Firm* — Armstrong Teasdale LLP

(57) ABSTRACT

A semiconductor on insulator multilayer structure is provided. The multilayer comprises a high resistivity single crystal semiconductor handle substrate, an optionally relaxed semiconductor layer comprising silicon, germanium, or silicon germanium, an optional polycrystalline silicon layer, a dielectric layer, and a single crystal semiconductor device layer.

11 Claims, 2 Drawing Sheets

Related U.S. Application Data

(60) Provisional application No. 62/081,352, filed on Nov. 18, 2014.

(56) References Cited

U.S. PATENT DOCUMENTS

| | | | |
|---|---|---|---|
| 4,968,384 | A | 11/1990 | Asano |
| 5,189,500 | A | 2/1993 | Kusunoki |
| 5,461,250 | A | 10/1995 | Burghartz et al. |
| 6,043,138 | A | 3/2000 | Ibok |
| 6,204,205 | B1 | 3/2001 | Yu et al. |
| 6,271,144 | B1 | 8/2001 | Monget et al. |
| 6,323,108 | B1 | 11/2001 | Kub et al. |
| 6,373,113 | B1 | 4/2002 | Gardner et al. |
| 6,479,166 | B1 | 11/2002 | Heuer et al. |
| 6,562,127 | B1 | 5/2003 | Kud et al. |
| 6,562,703 | B1 | 5/2003 | Maa et al. |
| 6,624,047 | B1 | 9/2003 | Sakaguchi et al. |
| 7,018,882 | B2 | 3/2006 | Tweet et al. |
| 7,868,419 | B1 | 1/2011 | Kerr et al. |
| 7,879,699 | B2 | 2/2011 | Schulze et al. |
| 7,915,716 | B2 | 3/2011 | Pisigan et al. |
| 8,058,137 | B1 | 11/2011 | Or-Bach et al. |
| 8,076,750 | B1 | 12/2011 | Kerr et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu et al. |
| 2002/0090758 | A1 | 7/2002 | Henley et al. |
| 2004/0003769 | A1 | 1/2004 | Tamatasuka et al. |
| 2004/0005740 | A1 | 1/2004 | Lochtefedl et al. |
| 2004/0031979 | A1 | 2/2004 | Lochtefeld et al. |
| 2004/0108537 | A1 | 6/2004 | Tiwari |
| 2004/0150006 | A1 | 8/2004 | Aulnette et al. |
| 2004/0213907 | A1 | 10/2004 | Todd et al. |
| 2005/0026432 | A1 | 2/2005 | Atwater, Jr. et al. |
| 2005/0153524 | A1 | 7/2005 | Maa et al. |
| 2005/0167002 | A1 | 8/2005 | Ghyselen et al. |
| 2006/0030124 | A1 | 2/2006 | Maa et al. |
| 2006/0033110 | A1 | 2/2006 | Alam et al. |
| 2006/0046431 | A1 | 3/2006 | Blietz et al. |
| 2006/0226482 | A1 | 10/2006 | Suvorov |
| 2007/0032040 | A1 | 2/2007 | Lederer |
| 2007/0054466 | A1 | 3/2007 | Hebras |
| 2007/0200144 | A1 | 8/2007 | Aspar et al. |
| 2008/0171443 | A1 | 7/2008 | Hebras |
| 2008/0299744 | A1 | 12/2008 | Yamazaki et al. |
| 2009/0004833 | A1 | 1/2009 | Suzuki et al. |
| 2009/0014828 | A1 | 1/2009 | Mizushima et al. |
| 2009/0042374 | A1* | 2/2009 | Pawlak ............ H01L 21/02667 438/522 |
| 2009/0092810 | A1 | 4/2009 | Lee et al. |
| 2009/0117716 | A1 | 5/2009 | Shimomura et al. |
| 2009/0189185 | A1* | 7/2009 | Arena ............ H01L 21/0262 257/E21.093 |
| 2009/0278233 | A1 | 11/2009 | Pinnington et al. |
| 2009/0321829 | A1 | 12/2009 | Nguyen et al. |
| 2011/0174362 | A1 | 7/2011 | Tanner et al. |
| 2011/0298083 | A1 | 12/2011 | Yoneda |
| 2012/0091587 | A1 | 4/2012 | Or-Bach et al. |
| 2012/0115310 | A1* | 5/2012 | Miu ............ C30B 29/52 257/E21.09 |
| 2012/0161310 | A1 | 6/2012 | Brindle et al. |
| 2012/0238070 | A1* | 9/2012 | Libbert ............ H01L 21/76251 438/455 |
| 2012/0267681 | A1 | 10/2012 | Nemoto et al. |
| 2012/0319121 | A1 | 12/2012 | Reynaud et al. |
| 2013/0084689 | A1 | 4/2013 | Arriagada et al. |
| 2013/0120951 | A1 | 5/2013 | Zuo et al. |
| 2013/0122672 | A1 | 5/2013 | Or-Bach et al. |
| 2013/0168835 | A1 | 7/2013 | Botula et al. |
| 2013/0193445 | A1 | 8/2013 | Dennard et al. |
| 2013/0294038 | A1 | 11/2013 | Landru et al. |
| 2013/0344680 | A1 | 12/2013 | Arriagada et al. |
| 2014/0042598 | A1 | 2/2014 | Kitada |
| 2014/0070215 | A1 | 3/2014 | Bedell et al. |
| 2014/0084290 | A1 | 3/2014 | Allibert et al. |
| 2014/0120654 | A1 | 5/2014 | Fujii et al. |
| 2014/0124902 | A1 | 5/2014 | Botula et al. |
| 2014/0273405 | A1 | 9/2014 | Liu et al. |
| 2015/0004778 | A1 | 1/2015 | Botula et al. |
| 2015/0115480 | A1 | 4/2015 | Peidous et al. |
| 2015/0112308 | A1 | 7/2015 | Peidous |
| 2016/0108551 | A1 | 4/2016 | Basak et al. |
| 2017/0033002 | A1 | 2/2017 | Meguro et al. |
| 2017/0345663 | A1 | 11/2017 | Ishizuka et al. |

FOREIGN PATENT DOCUMENTS

| | | | | |
|---|---|---|---|---|
| EP | 2426701 | A1 | 7/2012 | |
| EP | 2503592 | A1 | 9/2012 | |
| EP | 2579303 | A1 | 10/2013 | |
| JP | H01315144 | A | 12/1989 | |
| JP | 2004343052 | A | 12/2004 | |
| JP | 2007214199 | A | * 8/2007 | |
| JP | 2007214199 | A | 8/2007 | |
| JP | 2007258713 | A | * 10/2007 | ............ H01L 21/84 |
| JP | 2012253364 | A | 12/2012 | |
| JP | 2013513234 | A | 4/2013 | |
| WO | 2009120407 | A2 | 10/2009 | |
| WO | 2012127006 | A1 | 9/2012 | |
| WO | 2015112308 | A1 | 7/2015 | |
| WO | 2015119742 | A1 | 8/2015 | |

OTHER PUBLICATIONS

Lee, S.B. et al., Silicon epitaxial growth by rapid thermal processing chemical vapor deposition, Applied Physics Letter, May 1, 1989, pp. 1775-1777, vol. 54.

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546, vol. 72, No. 20.

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Tong, Q. Y. et al., Semiconductor wafer bonding: recent developments, Materials Chemistry and Physics, Mar. 1994, pp. 101/127, vol. 37, No. 2, Elsevier Sequoia.

(56) References Cited

OTHER PUBLICATIONS

Porrini, M. et al., Growth of Large Diameter High purity Silicon Single Crystals With The MCZ Method For Power Devices Applications, MADEP, Symposium On Materials And Devices For Powerelectronics, EPE Europen Conference On Power Electronics and Applications, Sep. 2, 1991, pp. 90-93.

International Search Report and Written Opinion prepared by the International Searching Authority regarding PCT/US2015/060854 dated Feb. 4, 2016; pp. 1-14.

\* cited by examiner

HIGH RESISTIVITY SEMICONDUCTOR-ON-INSULATOR WAFER AND A METHOD OF MANUFACTURE

CROSS-REFERENCE TO RELATED APPLICATION

This application is a divisional application of U.S. application Ser. No. 16/235,305, filed Dec. 28, 2018, and granted as U.S. Pat. No. 11,139,198, the disclosure of which is hereby incorporated by reference as if set forth in its entirety. U.S. application Ser. No. 16/235,305 is a divisional application of U.S. application Ser. No. 15/526,640, filed May 12, 2017 and granted as U.S. Pat. No. 10,483,152, the disclosure of which is hereby incorporated by reference as if set forth in its entirety. U.S. application Ser. No. 15/526,640 is a National Stage application of International Application No. PCT/US2015/060854, filed on Nov. 16, 2015, the disclosure of which is hereby incorporated by reference as if set forth in its entirety. International Application No. PCT/US2015/060854 claims priority to U.S. provisional patent application Ser. No. 62/081,352 filed on Nov. 18, 2014, the disclosure of which is hereby incorporated by reference as if set forth in its entirety.

THE FIELD OF THE INVENTION

The present invention generally relates to the field of semiconductor wafer manufacture. More specifically, the present invention relates to a method for forming a semiconductor-on-insulator (e.g., silicon-on-insulator) structure comprising a charge trapping layer.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates, and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The wafers are then pressed together, and a bond is formed there between. This bond is relatively weak, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one method of creating a semiconductor-on-insulator structure 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

Briefly, the present invention is directed to a multilayer structure comprising: a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm; a relaxed semiconductor layer comprising germanium, the relaxed semiconductor layer in interfacial contact with the front surface of the single crystal semiconductor handle substrate; a polycrystalline silicon layer in interfacial contact with the relaxed semiconductor layer; a dielectric layer in interfacial contact with the polycrystalline silicon layer; and a single crystal semiconductor device layer in interfacial contact with the dielectric layer.

The present invention is further directed to a method of preparing a multilayer structure. The method comprises: forming a semiconductor layer to be in interfacial contact with a front surface of a single crystal semiconductor handle substrate, the single crystal semiconductor handle substrate comprising two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm, and further wherein the semiconductor layer comprises germanium in a molar percent of germanium of at least 20 molar %; annealing the single crystal semiconductor handle substrate having the semiconductor layer in interfacial contact with the front surface of the single crystal semiconductor handle substrate for a temperature and a duration sufficient to at least partially relax the semiconductor layer, thereby forming a relaxed semiconductor layer; forming a polycrystalline silicon layer in interfacial contact with the relaxed semiconductor layer; and bonding a dielectric layer on a front surface of a single crystal semiconductor donor substrate to the polycrystalline silicon layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the front surface of the semiconductor donor substrate comprises the dielectric layer.

The present invention is still further directed to a multilayer structure comprising: a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm; a semiconductor layer comprising silicon germanium, the semiconductor layer in interfacial contact with the front surface of the single crystal semiconductor handle substrate; a dielectric layer in interfacial contact with the semiconductor layer comprising silicon and germanium; and a single crystal semiconductor device layer in interfacial contact with the dielectric layer.

The present invention is still further directed to a method of preparing a multilayer structure. The method comprises: depositing a semiconductor layer in interfacial contact with a front surface of a single crystal semiconductor handle substrate, the single crystal semiconductor handle substrate comprising two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm, further wherein the semiconductor layer comprises silicon germanium, and further wherein the molar percent of germanium in the semiconductor layer comprising silicon germanium is at least 5 molar %; and bonding a dielectric layer in interfacial contact with a front surface of a single crystal semiconductor donor substrate to the semiconductor layer comprising silicon germanium in interfacial contact with the front surface of a single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the front surface of the semiconductor donor substrate comprises the dielectric layer.

Other objects and features of this invention will be in part apparent and in part pointed out hereinafter.

DETAILED DESCRIPTION OF THE EMBODIMENT(S) OF THE INVENTION

Figure 1:
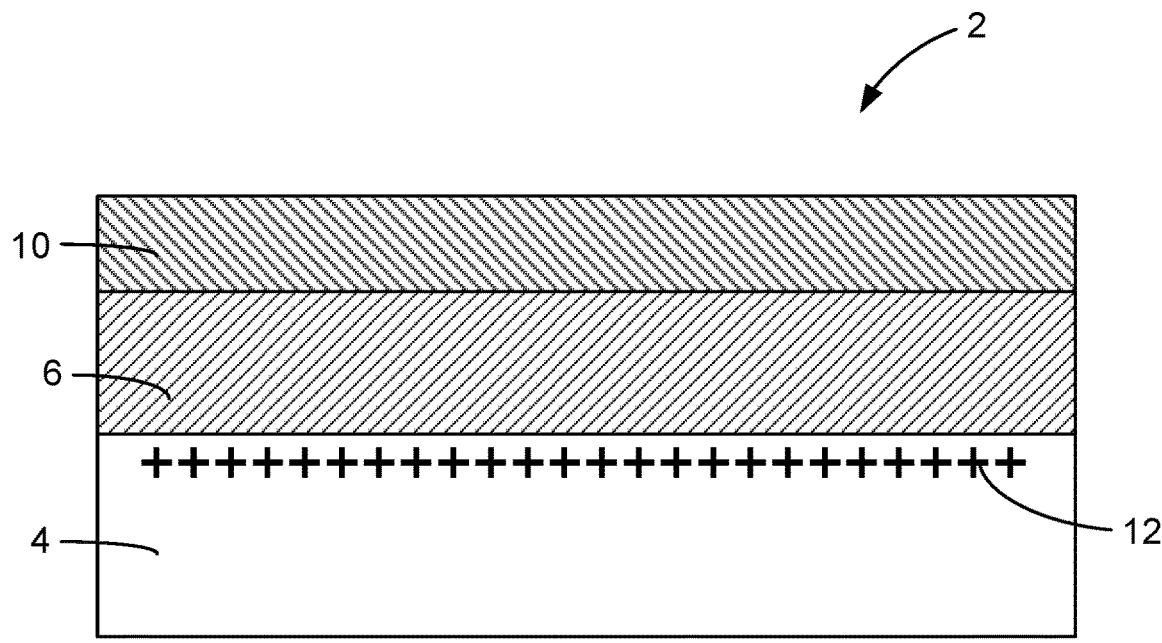
FIG. 1 is a depiction of a silicon-on-insulator wafer comprising a high resistivity substrate and a buried oxide layer.
Figure 2:
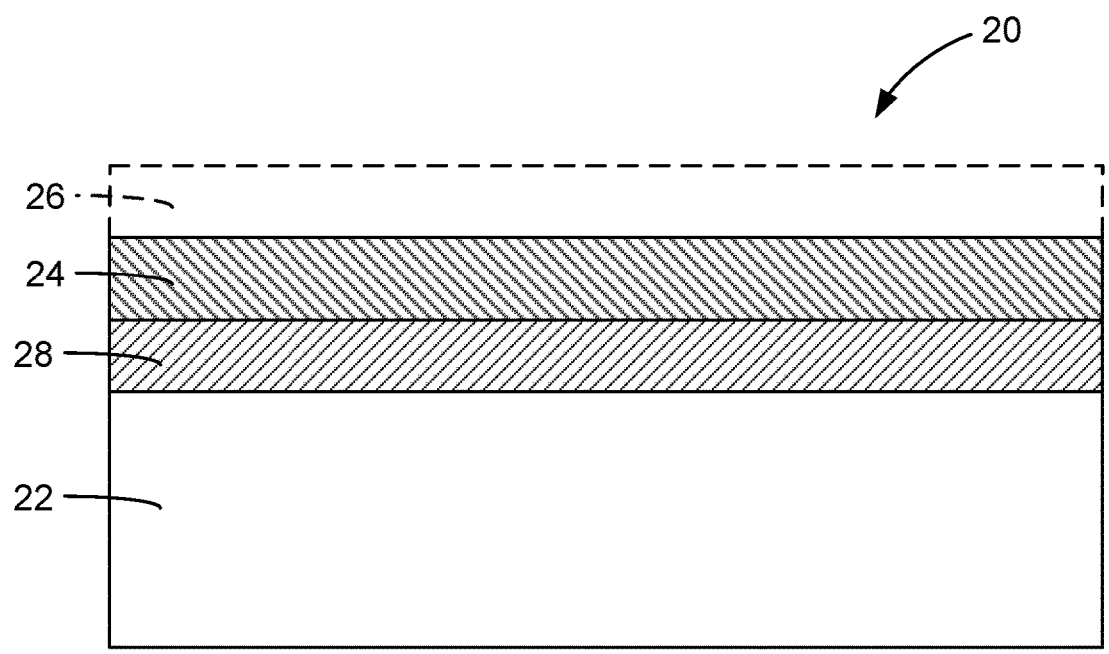
FIG. 2 is a depiction of a silicon-on-insulator wafer comprising a polycrystalline silicon charge trapping layer between a high resistivity substrate and a buried oxide layer.

According to the present invention, a method is provided for producing a charge trapping layer on a single crystal semiconductor handle substrate, e.g., a single crystal semiconductor handle wafer. The single crystal semiconductor handle substrate, e.g., a single crystal semiconductor handle wafer, comprising the charge trapping layer is useful in the production of a semiconductor-on-insulator (e.g., silicon-on-insulator) structure. According to the present invention, the charge trapping layer in the single crystal semiconductor handle substrate, e.g., a single crystal semiconductor handle wafer, is formed at the region near the oxide interface. Advantageously, the method of the present invention provides a highly defective charge trapping layer that is stable against thermal processing, such as subsequent thermal process steps of semiconductor-on-insulator substrate and device manufacture.

In some embodiments, the present invention is directed to a method of forming a semiconductor-on-insulator structure (e.g., silicon-on-insulator (SOI)) suitable for radio frequency (RF) device applications. A semiconductor-on-insulator structure comprises a device layer, a buried oxide layer, and a high resistivity silicon handle wafer. Additionally, the high resistivity handle also contains a polycrystalline silicon layer capable of trapping charges formed on the handle surface next to the interface of BOX layer and handle wafer of the SOI structure. In some embodiments of the invention, a fully relaxed layer of high concentration SiGe or pure Ge is formed between the high resistivity handle wafer and polycrystalline silicon layer to provide dislocation network preventing re-crystallization of the polycrystalline silicon charge trapping layer during the high temperature process steps involved in SOI manufacture.

In some embodiments, the present invention is directed to a method of forming a high resistivity single crystal semiconductor handle substrate with an improved immunity against formation of an inversion layer. The high resistivity single crystal semiconductor handle substrate is prepared to have a high concentration of Germanium at the BOX/Substrate interface. Germanium exhibits extremely poor electron mobility at the interfaces with oxides. Additionally, the Ge/SiO$_2$ interface has high interface defects which act as charge traps. In the result, the formation on the N-type inversion layer is suppressed. Finally, even if an N-type inversion layer forms, the conductivity through the Ge layer is low due to the poor electron mobility. Consequently, RF devices made using the single crystal semiconductor handle substrate comprising the Ge layer have improved performance.

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the semiconductor donor substrate, e.g., a single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. It is upon this front surface that the charge trapping layer is formed. Accordingly, a "back surface" of a single crystal semiconductor handle substrate, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure. The front surface of a single crystal semiconductor donor substrate often comprises a dielectric layer, e.g., a silicon dioxide layer, which forms the buried oxide (BOX) layer in the final structure. A "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In some embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. In some preferred embodiments, the semiconductor wafers comprise a semiconductor material selected from among silicon, silicon carbide, and silicon germanium. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor wafers, i.e., handle wafer and donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon handle wafer comprises oxygen in a concentration of no greater than about 10 PPMA. Interstitial oxygen may be measured according to SEMI MF 1188-1105.

In some embodiments, the semiconductor handle substrate, e.g., a single crystal semiconductor handle substrate, such as a single crystal silicon handle wafer, has a relatively high minimum bulk resistivity. High resistivity wafers are generally sliced from single crystal ingots grown by the Czochralski method or float zone method. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 10 Ohm-cm, at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the single crystal semiconductor handle substrate comprises a p-type or an n-type dopant. Suitable dopants include Arsenic, Phosphorus, and Boron. In some embodiments, the single crystal semiconductor handle substrate comprises a p-type dopant. In some embodiments, the single crystal semiconductor handle substrate is a single crystal silicon wafer comprising a p-type dopant, such as boron. The boron dopant is present in a relatively low concentration, e.g., less than $1\times10^{14}$ atoms/cm$^3$, preferably less than $1\times10^{13}$ atoms/cm$^3$, so as to obtain high resistivity handle substrates.

In some embodiments, the single crystal semiconductor handle wafer surface could be intentionally damaged by a sound blasting process or by a caustic etch. In some embodiments, the front surface of the single crystal semiconductor handle wafer may be oxidized by conventional oxidation methods, such as thermal oxidation (in which some portion of the single crystal semiconductor material will be consumed) and/or CVD oxide deposition prior to deposition of the charge trapping layer.

According to the method of the present invention, a charge trapping layer is deposited on the front surface of a single crystal semiconductor handle substrate. In some embodiments, semiconductor material is deposited onto the exposed front surface of the single crystal semiconductor handle wafer, which may, optionally, comprise an exposed oxidized front surface layer. Semiconductor material suitable for use in forming a charge trapping layer in a semiconductor-on-insulator device is suitably capable of forming a highly defective layer in the fabricated device. Such materials include single crystalline semiconductor materials, polycrystalline semiconductor materials, and amorphous semiconductor materials. The single crystalline, polycrystalline, or amorphous semiconductor material comprises silicon, germanium, or a combination of silicon and germanium. Single crystalline semiconductor material comprising silicon, germanium, or a combination of silicon and germanium may be deposited by epitaxial techniques convention in the art. Polycrystalline material denotes a material comprising small crystals having random crystal orientations. Polycrystalline grains may be as small in size as about 20 nanometers. According to the method of the present invention, the smaller the crystal grain size of polycrystalline material deposited the higher the defectivity in the charge trapping layer. Amorphous material comprises a non-crystalline allotropic forms of silicon and germanium, which lacks short range and long range order. Grains having crystallinity over no more than about 10 nanometers may also be considered essentially amorphous. Polycrystalline and amorphous material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon germanium comprises an alloy of silicon germanium in any molar ratio of silicon and germanium. The semiconductor material comprising silicon and germanium may be doped with carbon. Preferably, the charge trapping layer has a resistivity at least about 1000 Ohm-cm, or at least about 3000 Ohm-cm, such as between about 1000 Ohm-cm and about 100,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm.

In some embodiments, particularly wherein a polycrystalline silicon charge trapping layer is subsequently deposited on the single crystal semiconductor handle substrate, the semiconductor material comprises silicon and germanium wherein the molar percent of germanium is at least 20 molar %. In some embodiments, the semiconductor material comprises silicon and germanium, wherein the molar percent of germanium is at least about 50 molar %, at least about 90 molar %, such as at least about 99.9 molar %. In some embodiments, the semiconductor material consists essentially of germanium. Herein, a semiconductor material that consists essentially of germanium is formed by deposition using germanium precursors. The final semiconductor material consisting essentially of germanium comprises no more than about 0.1 molar %, preferably no more than about 0.01 molar %, trace impurities that preferably do not affect the physical and electrical properties of the germanium layer. The semiconductor material comprising silicon, germanium, or a combination of silicon and germanium may be deposited to a thickness greater than the critical thickness, i.e., the thickness beyond which the elastic strain due to lattice mismatch may be relaxed during a strain relaxing thermal anneal. The critical thickness may depend upon the concentration of germanium. The lower the germanium concentration, the larger the critical thickness. Accordingly, the deposited semiconductor layer comprising silicon and germanium having at least about 20 molar % Ge is generally deposited to a thickness between about 1 nanometer and about 3000 nanometers, such as between about 10 nanometers and about 3000 nanometers, such as between about 10 nanometers and about 1000 nanometers. As the Ge concentration increases, the critical thickness may be less. For a 100 molar % Ge layer, the thickness is between about 0.1 nanometers and about 1000 nanometers, such as between about 1 nanometer and about 1000 nanometers, or between about 10 nanometer and about 500 nanometers.

In some embodiments, the semiconductor layer comprises silicon and germanium, wherein the germanium content is at least about 5 molar %. In some embodiments, the semiconductor layer comprises silicon and germanium, wherein the germanium content is no more than about 20 molar %, such as between about 5 molar % and about 20 molar %. In some embodiments, the germanium enriched silicon layer is deposited on the front surface of the single crystal semiconductor handle substrate acts alone as the charge trapping layer. At lower concentrations of Ge, the layer may be more thickly deposited to ensure relaxation, such as between about 5 nanometers and about 4000 nanometers, or between about 10 nanometers and about 3000 nanometers, or between about 20 nanometers and about 1000 nanometers. In some embodiments, the germanium enriched silicon layer may comprise carbon, in an amount between about 0.1 molar % and about 5 molar %, such as between about 0.5 molar % and about 1 molar %. In such embodiments, the layer may have a thickness between about 10 nanometers and about 8000 nanometers, or between about 10 nanometers and about 6000 nanometers, or between about 20 nanometers and about 3000 nanometers.

The material for deposition onto the front surface of the single crystal semiconductor handle wafer to thereby form the charge trapping layer may be deposited by means known in the art. For example, the semiconductor material may be deposited using epitaxial deposition, metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. For example, polycrystalline silicon may be deposited onto the surface oxidation layer by pyrolyzing silane ($SiH_4$) in a temperature range between about 550° C. and about 690° C., such as between about 580° C. and about 650° C. The chamber pressure may range from about 70 to about 400 mTorr. Amorphous silicon may be deposited by plasma enhanced chemical vapor deposition (PECVD) at temperatures generally ranging between about 75° C. and about 300° C. Silicon germanium, particularly amorphous silicon germanium, may be deposited at temperatures up to about 300° C. by chemical vapor deposition by including organogermanium compounds, such as isobutylgermane, alkylgermanium trichlorides, and dimethylaminogermanium trichloride. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane.

In some embodiments, after deposition of the layer of semiconductor material comprising silicon, germanium, or silicon and germanium, optionally the single crystal semiconductor handle substrate may be annealed at a temperature and duration sufficient to at least partially relax, or fully relax the semiconductor material comprising silicon, germanium, or silicon and germanium. Elastic strain begins to relax at elevated temperatures. The relaxation is realized by generating misfit dislocations at the interface between the layer and the high resistivity semiconductor handle substrate. After anneal, a high density of misfit dislocations and threading dislocations are present, i.e., on the order of $1\times10^5$ to $1\times10^{10}$ per $cm^2$. The relaxation anneal may occur at a temperature in excess of 600° C., such as between about 700° C. and about 900° C. The relaxation anneal may occur for a duration between about 1 second and about 1 hour, such as between about 10 seconds and about 30 minutes, such as between about 1 minute and about 30 minutes.

In some embodiments, a polycrystalline silicon layer may be deposited on the relaxed layer of semiconductor material comprising silicon, germanium, or silicon and germanium. The polycrystalline silicon layer may be deposited as described above, using suitable silicon precursors and conditions. The combination of the relaxed layer of semiconductor material comprising silicon, germanium, or silicon and germanium and the polycrystalline silicon layer acts as a charge trapping layer. Advantageously, a fully relaxed layer comprising SiGe or consisting essentially of Ge is formed between the high resistivity handle wafer and polycrystalline silicon layer to provide dislocation network preventing re-crystallization of the polycrystalline silicon charge trapping layer during the high temperature process steps involved in SOI manufacture. The polycrystalline silicon layer may be deposited to a thickness between about 0.5 micrometer and about 3 micrometers, or between about 1 micrometer and about 3 micrometers.

In some embodiments, after deposition of the layer of semiconductor material comprising silicon, germanium or both silicon and germanium, and optional deposition of a polycrystalline silicon film, optionally an oxide film is formed on top of the deposited charge trapping layer. This may be accomplished by means known in the art, such as thermal oxidation (in which some portion of the deposited semiconductor material film will be consumed) and/or CVD oxide deposition. In some embodiments, the charge trapping layer may be thermally oxidized (in which some portion of the deposited semiconductor material film will be consumed) or the silicon dioxide film may be grown by CVD oxide deposition. In some embodiments, the charge trapping layer deposited on the front surface of the single crystal semiconductor handle substrate may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor handle wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In order to incorporate nitrogen in the interfacial layer to deposit silicon nitride or silicon oxynitride, the atmosphere may comprise nitrogen alone or a combination of oxygen and nitrogen, and the temperature may be increased to a temperature between 1100° C. and 1400° C. An alternative nitrogen source is ammonia. In some embodiments, the charge trapping layer may be oxidized for a duration sufficient to provide an oxide layer of at least about 0.01 micrometers thick, or at least about 0.05 micrometers thick, such as between about 0.05 micrometers and about 4 micrometers, such as between about 0.1 micrometers and about 2 micrometers, or between about 0.2 micrometers and about 0.4 micrometers. Oxidation of a film comprising silicon germanium or germanium may cause Ge to become enriched at the interface of the oxide layer and the front surface of the single crystal silicon handle substrate. This gives rise to very high concentration of Ge between the oxide and the substrate. The oxidation of Si then proceeds by Si diffusing though the Ge-rich layer. In this way, the desired structure of the SOI wafer is formed. The oxidation process additionally oxidizes the back surface of the single crystal semiconductor handle wafer, which advantageously reduces warp and bow potentially caused by the different coefficients of thermal expansion of silicon and silicon dioxide.

After deposition of the charge trapping layer, and optional oxidation, wafer cleaning is optional. If desired, the wafers can be cleaned, for example, in a standard SC1/SC2 solution. Additionally, the wafers, particularly, the silicon dioxide layer on the charge trapping layer, may be subjected to chemical mechanical polishing (CMP) to reduce the surface roughness, preferably to the level of $RMS_{2\times2\ um2}$ is less than about 5 angstroms, wherein root mean squared $$R_q = \sqrt{\frac{1}{n}\sum_{i=1}^{n} y_i^2},$$

the roughness profile contains ordered, equally spaced points along the trace, and $y_i$ is the vertical distance from the mean line to the data point.

The single crystal semiconductor handle wafer prepared according to the method described herein to comprise a charge trapping layer, and, optionally, an oxide film, is next bonded a single crystal semiconductor donor substrate, e.g., a single crystal semiconductor donor wafer, which is prepared according to conventional layer transfer methods. That is, the single crystal semiconductor donor wafer may be subjected to standard process steps including oxidation, implant, and post implant cleaning. Accordingly, a single crystal semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the front surface of the single crystal semiconductor donor substrate may be thermally oxidized (in which some portion of the semiconductor material will be consumed) or the silicon dioxide film may be grown by CVD oxide deposition. In some embodiments, the single crystal semiconductor donor substrate, e.g., a single crystal silicon donor wafer, may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor donor wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In some embodiments, the donor substrates are oxidized to provide an oxide layer on the front surface layer of at least about 1 nanometer thick, such as between about 0.01 micrometers and about 10 micrometers, such as between about 0.01 micrometers and about 2 micrometers, or between about 0.1 micrometers and about 1 micrometers. The oxidation process additionally oxidizes the back surface of the donor substrate, which advantageously reduces warp and bow potentially caused by the different coefficients of thermal expansion of silicon and silicon dioxide.

Ion implantation of the single crystal semiconductor donor substrate may be carried out in a commercially available instrument, such as an Applied Materials Quantum H. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$. Implant energies may range from about 1 keV to about 3,000 keV, such as from about 10 keV to about 3,000 keV. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate having an ion implant region therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG® 810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface layer of the single crystal semiconductor donor substrate and the front surface of the single crystal semiconductor handle substrate, which comprises the charge trapping layer and may further be optionally oxidized, are next brought into intimate contact to thereby form a bonded structure. Since the mechanical bond is relatively weak, the bonded structure is further annealed to solidify the bond between the donor wafer and the handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 0.5 hours to about 10 hours, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, the cleaved structure may be subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor donor wafer may be brought to the desired thickness and smoothness by subjecting to a vapor phase HCl etch process in a horizontal flow single wafer epitaxial reactor using $H_2$ as a carrier gas. In some embodiments, the thickness of the device layer may be between about 1 nanometer and about 100 micrometers, such as between about 10 nanometers and about 50 micrometers. In some embodiments, an epitaxial layer may be deposited on the transferred device layer. The finished SOI wafer comprises the semiconductor handle substrate, the charge trapping layer, the dielectric layer (e.g., buried oxide layer), and the semiconductor device layer, may then be subjected to end of line metrology inspections and cleaned a final time using typical SC1-SC2 process.

Figure 3:
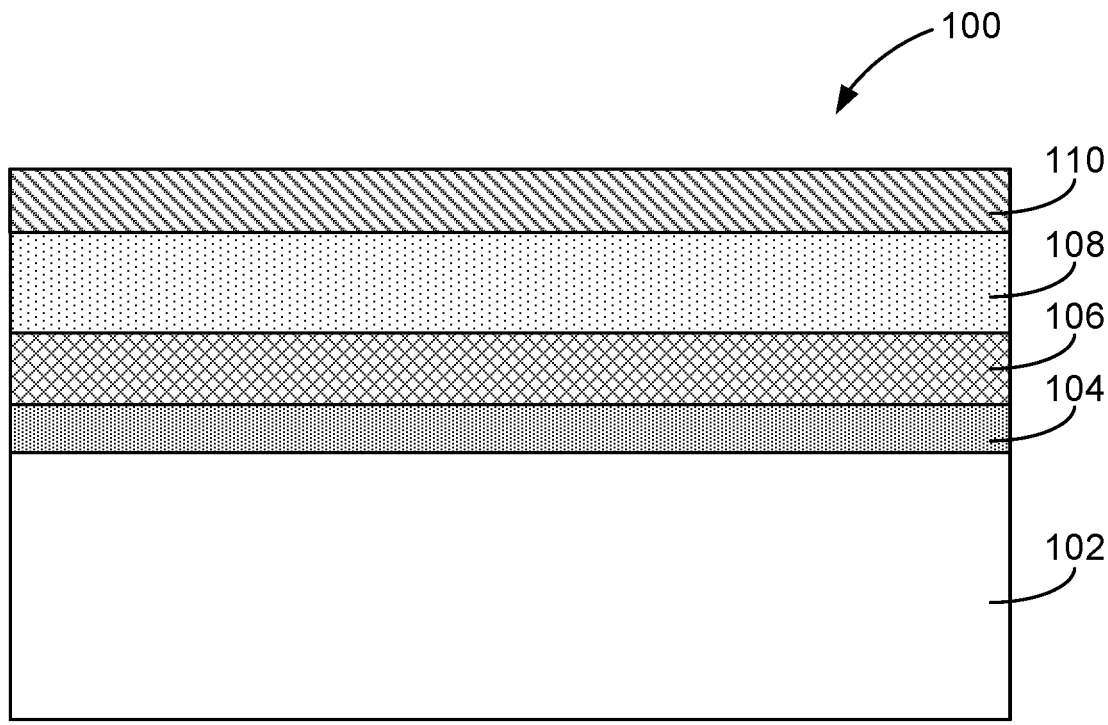
FIG. 3 is a depiction of a silicon-on-insulator wafer according to the invention.

According to the present invention, SOI wafers are obtained with the deposited semiconductor material charge trapping layer embedded underneath of BOX. With reference now to FIG. 3, in some embodiments, a semiconductor-on-insulator structure 100, e.g., a silicon-on-insulator wafer according to some embodiments of the invention is depicted. The semiconductor-on-insulator structure 100, e.g., a silicon-on-insulator wafer comprises a high resistivity semiconductor substrate 102, e.g., a high resistivity single crystal silicon substrate. A relaxed SiGe or Ge layer 104 is formed in interfacial contact with the front surface of the high resistivity semiconductor substrate 102, e.g., a high resistivity single crystal silicon substrate. A polycrystalline silicon layer 106 is formed in interfacial contact with the relaxed SiGe or Ge layer 104. A buried oxide layer 108 is located between the relaxed SiGe or Ge layer 104 and a single crystal semiconductor device layer 110, e.g., a silicon device layer. The buried oxide layer 108 may be formed from oxidized portions of the relaxed SiGe or Ge layer 104 and the single crystal semiconductor device layer 110, e.g., a silicon device layer.

Figure 4:
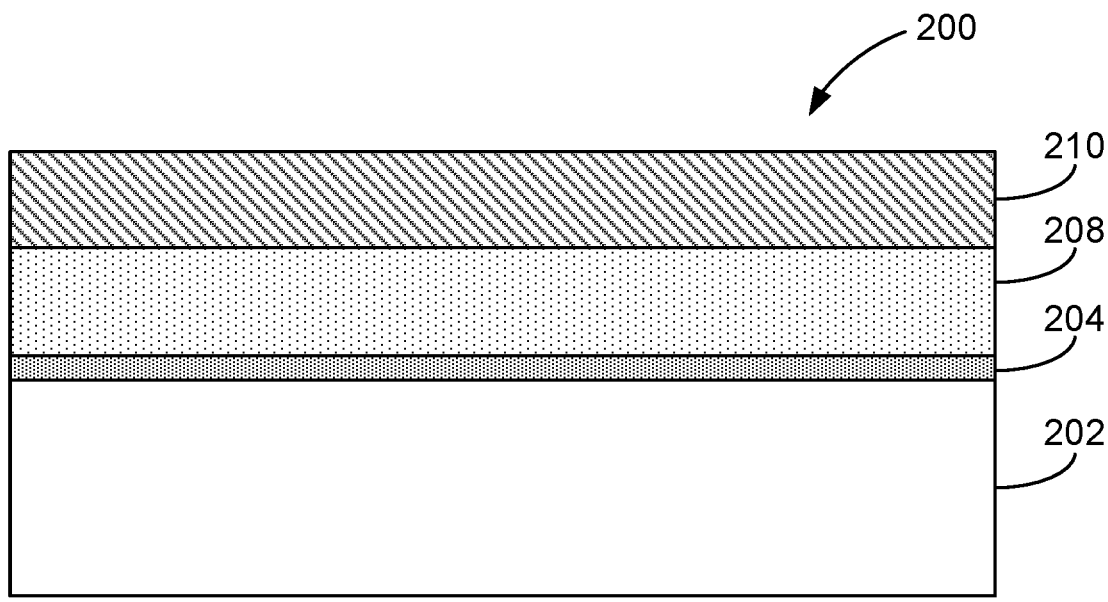
FIG. 4 is a depiction of a silicon-on-insulator wafer according to the invention.

With reference now to FIG. 4, in some embodiments, a semiconductor-on-insulator structure 200, e.g., a silicon-on-insulator wafer according to some embodiments of the invention is depicted. The semiconductor-on-insulator structure 200, e.g., a silicon-on-insulator wafer comprises a high resistivity semiconductor substrate 202, e.g., a high resistivity single crystal silicon substrate. A Ge-rich layer 204 is formed in interfacial contact with the front surface of the high resistivity semiconductor substrate 202, e.g., a high resistivity single crystal silicon substrate. A buried oxide layer 208 is located between Ge-rich layer 204 and a single crystal semiconductor device layer 210, e.g., a silicon device layer. The buried oxide layer 208 may be formed from oxidized portions of the Ge-rich layer 204 and the single crystal semiconductor device layer 110, e.g., a silicon device layer.

Having described the invention in detail, it will be apparent that modifications and variations are possible without departing from the scope of the invention defined in the appended claims.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

We claim:

1. A multilayer structure comprising:
a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm;
a semiconductor layer comprising amorphous silicon germanium having grain sizes of less than about 10 nanometers or polycrystalline silicon germanium having grain sizes of about 20 nanometers, wherein the amorphous silicon germanium or the polycrystalline silicon germanium has a molar percent of germanium of at least about 5 molar %, and further wherein the semiconductor layer comprises dislocations selected from the group consisting of misfit dislocations, threading dislocations, and a combination thereof, wherein a concentration of dislocations is between $1 \times 10^5/cm^2$ and $1 \times 10^{10}/cm^2$;
a dielectric layer comprising a material selected from the group consisting of silicon dioxide, silicon nitride, hafnium oxide, titanium oxide, zirconium oxide, lanthanum oxide, barium oxide, and a combination thereof; and
a single crystal semiconductor device layer.

2. The multilayer structure of claim 1 wherein the single crystal semiconductor handle substrate has a bulk resistivity between about 1000 Ohm-cm and about 100,000 Ohm-cm.

3. The multilayer structure of claim 1 wherein the single crystal semiconductor handle substrate has a bulk resistivity between about 3000 Ohm-cm and about 10,000 Ohm-cm.

4. The multilayer structure of claim 1 wherein the single crystal semiconductor handle substrate comprises a single crystal silicon wafer, which has a bulk resistivity between about 3000 Ohm-cm and about 100,000 Ohm-cm.

5. The multilayer structure of claim 1 wherein the single crystal semiconductor handle substrate comprises a single crystal silicon wafer, which has a bulk resistivity between about 3000 Ohm-cm and about 5,000 Ohm-cm.

6. The multilayer structure of claim 1 wherein the semiconductor layer has an average thickness between about between about 5 nanometers and about 4000 nanometers.

7. The multilayer structure of claim 1 wherein the molar percent of germanium is at least 50 molar %.

8. The multilayer structure of claim 1 wherein the molar percent of germanium is at least 90 molar %.

9. The multilayer structure of claim 1 wherein the semiconductor layer comprises carbon in a concentration between 0.1 molar % and 5 molar %.

10. The multilayer structure of claim 1 wherein the semiconductor layer comprises carbon in a concentration between 0.5 molar % and 15 molar %.

11. The multilayer structure of claim 1 further comprising a charge trapping layer comprising polycrystalline silicon in interfacial contact with the semiconductor layer, wherein the charge trapping layer has a resistivity of at least about 1000 ohm-cm.

* * * * *